(12) United States Patent
Crowder

(10) Patent No.: US 6,690,693 B1
(45) Date of Patent: Feb. 10, 2004

(54) POWER AND WAVELENGTH CONTROL OF SAMPLED GRATING DISTRIBUTED BRAGG REFLECTOR LASERS

(75) Inventor: Paul F. Crowder, Santa Barbara, CA (US)

(73) Assignee: Agility Communications, Inc., Goleta, CA (US)

(*) Notice: Subject to any disclaimer, the term of this patent is extended or adjusted under 35 U.S.C. 154(b) by 77 days.

(21) Appl. No.: 09/895,598

(22) Filed: Jun. 29, 2001

Related U.S. Application Data

(63) Continuation-in-part of application No. 09/895,303, filed on Jun. 29, 2001, and a continuation-in-part of application No. 09/895,848, filed on Jun. 29, 2001, and a continuation-in-part of application No. 09/879,821, filed on Jun. 11, 2001, and a continuation-in-part of application No. 09/872,438, filed on Jun. 1, 2001, and a continuation-in-part of application No. 09/848,791, filed on May 4, 2001.

(60) Provisional application No. 60/215,739, filed on Jun. 29, 2000, provisional application No. 60/215,170, filed on Jun. 29, 2000, provisional application No. 60/215,742, filed on Jun. 29, 2000, provisional application No. 60/203,052, filed on May 4, 2000, provisional application No. 60/209,068, filed on Jun. 2, 2000, and provisional application No. 60/210,612, filed on Jun. 9, 2000.

(51) Int. Cl.[7] .................................................. H01S 3/13
(52) U.S. Cl. .................................. 372/29.02; 372/29.01
(58) Field of Search ................................. 372/29, 29.02

(56) References Cited

U.S. PATENT DOCUMENTS

| | | | |
|---|---|---|---|
| 4,622,672 A | | 11/1986 | Coldren |
| 4,728,188 A | * | 3/1988 | Kitagawa et al. ........... 356/218 |
| 4,896,325 A | | 1/1990 | Coldren |
| 5,255,276 A | * | 10/1993 | Tabuchi et al. ............... 372/32 |
| 5,325,392 A | | 6/1994 | Tohmori et al. |
| 5,392,311 A | | 2/1995 | Makuta |
| 5,579,328 A | | 11/1996 | Habel et al. |
| 5,715,271 A | | 2/1998 | Huang et al. |

(List continued on next page.)

FOREIGN PATENT DOCUMENTS

| | | |
|---|---|---|
| EP | 0 774 684 A2 | 5/1997 |
| EP | 0 926 789 A2 | 6/1999 |
| WO | WO 99/40654 | 8/1999 |

OTHER PUBLICATIONS

Lattice Press, Wolf, S., "Silicon Processing for the VLSI Era: vol. 2—Process Integration", pp. 232–233, 1990, Sunset Beach, California.

Ishii, Hiroyuki et al., "Mode Stabilization Method for Superstructure–Grating DBR Lasers", Journal of Lightwave Technology, IEEE, vol. 16, No. 3, Mar. 1, 1998, pp. 433–442, XP000751395.

Sarlet, G. et al., "Wavelength and Mode Stabilization of Widely Tunable SG–DBR and SSG–DBR Lasers", IEEE Photonics Technology Letters, IEEE, vol. 11, No. 11, Nov. 1999, pp. 1351–1353, XP000893767.

*Primary Examiner*—Paul Ip
*Assistant Examiner*—Phillip Nguyen
(74) *Attorney, Agent, or Firm*—Gates & Cooper LLP

(57) ABSTRACT

The invention discloses an optical output power and output wavelength control system for use with a sampled grating distributed Bragg reflector (SGDBR) laser. The optical output power and output wavelength control system for use with a sampled grating distributed Bragg reflector (SGDBR) laser comprises a controller for providing current inputs to the laser controlling the optical output power and output wavelength and an external reference receiving an optical output from the laser and providing a reference output to the control, wherein the controller compares the optical output power and output wavelength of the laser to the reference output and locks the optical output power and output wavelength of the laser to the external reference.

93 Claims, 12 Drawing Sheets

U.S. PATENT DOCUMENTS

| | | | | |
|---|---|---|---|---|
| 5,936,994 A | * | 8/1999 | Hong et al. | 372/96 |
| 5,966,159 A | * | 10/1999 | Ogasawara | 347/133 |
| 5,978,393 A | * | 11/1999 | Feldman et al. | 372/31 |
| 6,001,745 A | | 12/1999 | Tu et al. | 438/782 |
| 6,185,233 B1 | * | 2/2001 | Moothart et al. | 372/32 |
| 6,212,210 B1 | * | 4/2001 | Serizawa | 372/32 |
| RE37,524 E | * | 1/2002 | Taguchi | 372/29.011 |
| 6,345,135 B1 | | 2/2002 | Reid et al. | |
| 6,349,106 B1 | * | 2/2002 | Coldren | 372/50 |
| 6,359,918 B1 | * | 3/2002 | Bielas | 372/38.01 |
| 6,366,592 B1 | * | 4/2002 | Flanders | 372/18 |

* cited by examiner

POWER AND WAVELENGTH CONTROL OF SAMPLED GRATING DISTRIBUTED BRAGG REFLECTOR LASERS

CROSS-REFERENCE TO RELATED APPLICATIONS

This application claims the benefit under 35 U.S.C. §119 (e) of the following co-pending and commonly-assigned U.S. patent applications:

Provisional Application Serial No. 60/215,739, filed Jun. 29, 2000, by Gregory A. Fish and Larry A. Coldren, entitled "OPEN LOOP CONTROL OF SGDBR LASERS;"

Provisional Application Serial No. 60/215,170, filed Jun. 29, 2000, by Paul F. Crowder, entitled "POWER AND WAVELENGTH CONTROL OF SGDBR LASERS,"; and Provisional Application Serial No. 60/215,742, filed in Jun. 29, 2000, by Paul F. Crowder and Larry A. Coldren, entitled "GAIN VOLTAGE CONTROL OF SGDBR LASERS;"

all of which applications are incorporated by reference herein.

This application is a continuation-in-part patent application of the following co-pending and commonly-assigned U.S. patent applications:

Utility Application Ser. No. 09/848,791, filed May 4, 2001, by Gregory A. Fish and Larry A. Coldren, entitled "IMPROVED MIRROR AND CAVITY DESIGNS FOR SAMPLED GRATING DISTRIBUTED BRAGG REFLECTOR LASERS," which claims the benefit under 35 U.S.C. §119(e) of Provisional Application Ser. No. 60/203,052, filed May 4, 2000, by Gregory A. Fish and Larry A. Coldren, entitled "IMPROVED MIRROR AND CAVITY DESIGNS FOR SGDBR LASERS;"

Utility Application Ser. No. 09/872,438, filed Jun. 1, 2001, by Larry A. Coldren, Gregory A. Fish, and Michael C. Larson, entitled "HIGH-POWER, MANUFACTURABLE SAMPLED GRATING DISTRIBUTED BRAGG REFLECTOR LASERS," which claims the benefit under 35 U.S.C. §119(e) of Provisional Application Serial No. 60/209,068, filed Jun. 2, 2000, by Larry A. Coldren Gregory A. Fish, and Michael C. Larson, and entitled "HIGH-POWER, MANUFACTURABLE SAMPLED-GRATING DBR LASERS;"

Utility Application Ser. No. 09/879,821, filed Jun. 11, 2001, by Gregory A. Fish and Larry A. Coldren, entitled "IMPROVED, MANUFACTURABLE SAMPLED GRATING MIRRORS," which claims the benefit under 35 U.S.C. §119(e) of Provisional Application Serial No. 60/210,612, filed Jun. 9, 2000, by Gregory A. Fish and Larry A. Coldren, entitled "IMPROVED, MANUFACTURABLE SAMPLED GRATING MIRRORS;"

Utility Application Ser. No. 09/895,848, filed on Jun. 29, 2001, by Paul E. Crowder, entitled "OPEN LOOP CONTROL OF SGDBR LASERS," which claims the benefit under 35 U.S.C. §119(e) of Provisional Application Ser. No. 60/215,739, filed Jun. 29, 2000, by Paul F. Crowder, entitled "OPEN LOOP CONTROL OF SGDBR LASERS;"

Utility Application Ser. No. 09/895,303, filed on Jun. 29, 2001, by Paul F. Crowder and Larry A. Coldren, entitled "GAIN VOLTAGE CONTROL OF SAMPLED GRATING DISTRIBUTED BRAGG REFLECTOR LASERS," which claims the benefit under 35 U.S.C. §119(e) of Provisional Application Serial No. 60/215,742, filed Jun. 29, 2000, by Paul F. Crowder and Larry A. Coldren, entitled "GAIN VOLTAGE CONTROL OF SGDBR LASERS;"

all of which applications are incorporated by reference herein.

BACKGROUND OF THE INVENTION

1. Field of the Invention

The present invention relates to power and wavelength control for semiconductor diode lasers, and particularly, power and wavelength control for Sampled Grating Distributed Bragg Reflector (SGDBR) semiconductor lasers.

2. Description of the Related Art

Diode lasers are being used in such applications as optical communications, sensors and computer systems. In such applications, it is very useful to employ lasers that can be easily adjusted to output frequencies across a wide wavelength range. A diode laser which can be operated at selectably variable frequencies covering a wide wavelength range, i.e. a widely tunable laser, is an invaluable tool. The number of separate channels that can utilize a given wavelength range is exceedingly limited without such a laser. Accordingly, the number of individual communications paths that can exist simultaneously in a system employing such range-limited lasers is similarly very limited. Thus, while diode lasers have provided solutions to many problems in communications, sensors and computer system designs, they have not fulfilled their potential based on the available bandwidth afforded by light-based systems. It is important that the number of channels be increased in order for optical systems to be realized for many future applications.

For a variety of applications, it is necessary to have tunable single-frequency diode lasers which can select any of a wide range of wavelengths. Such applications include sources and local oscillators in coherent lightwave communications systems, sources for other multi-channel lightwave communication systems, and sources for use in frequency modulated sensor systems. Continuous tunability is usually needed over some range of wavelengths. Continuous tuning is important for wavelength locking or stabilization with respect to some other reference, and it is desirable in certain frequency shift keying modulation schemes.

In addition, widely tunable semiconductor lasers, such as the sampled-grating distributed-Bragg-reflector (SGDBR) laser, the grating-coupled sampled-reflector (GCSR) laser, and vertical-cavity spontaneous emission lasers which micro-electro-mechanical moveable mirrors (VCSEL-MEMs) generally must compromise their output power in order to achieve a large tuning range. The basic function and structure of SGDBR lasers is detailed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. Designs that can provide over 40 nm of tuning range have not been able to provide much more than a couple of milliwatts of power out at the extrema of their tuning spectrum. However, current and future optical fiber communication systems as well as spectroscopic applications require output powers in excess of 10 mW over the full tuning band. Current International Telecommunication Union (ITU) bands are about 40 nm wide near 1.55 μm, and it is desired to have a single component that can cover at least this optical bandwidth. Systems that are to operate at higher bit rates will require more than 20 mW over the full ITU bands. Such powers are available from distributed feedback (DFB) lasers, but these can only be tuned by a couple to nanometers by adjusting their temperature. Thus, it is very desirable to have a source with both wide tuning range (>40 nm) and higher power (>20 mW) without a significant increase in fabrication complexity over existing widely tunable designs. Furthermore, in addition to control of the output wavelength, control of the optical power output for a tunable laser is an equally important endeavor as optical power determines the potential range for the laser.

Thus, there is a need in the art for devices and methods to precisely control of the power and wavelength output of semiconductor lasers. The present invention meets these needs.

SUMMARY OF THE INVENTION

The present invention discloses devices and methods for controlling the power and wavelength of semiconductor lasers. A typical optical output power and output wavelength control systems of the invention for use with a sampled grating distributed Bragg reflector (SGDBR) laser comprises a controller for providing current or voltage inputs to the laser and current or voltage inputs to the thermal electric cooler controlling the optical output power and output wavelength and an external reference receiving an optical output from the laser and providing a reference output to the controller, wherein the controller compares the optical output power and output wavelength of the laser to the reference output and locks the optical output power and output wavelength of the laser to the external reference.

To accurately control the optical output power and precisely control the output wavelength of a tunable laser, a feedback loop is used in conjunction with an external reference wavelength locker, e.g., a Fabry-Perot Etalon reference though not limited to, to lock the SGDBR laser optical output power and wavelength to the reference. The feedback loop compensates for the drift of the controller current sources, as well as providing compensation for long-term degradation of the SGDBR laser. Further, the present invention provides compensation for the SGDBR laser operating points over an ambient temperature range.

The power and wavelength controls may operate as independent controls of the SGDBR laser, or can be controlled in an interdependent manner to accurately provide a given optical power and output wavelength regardless of the length of time that the SGDBR laser has been in use, the ambient temperature, or other external conditions of where the SGDBR laser is operating.

In an independent control system, each control algorithm induces changes in one current or operating temperature independent of the other using proportional integral control routines. In an interdependent control schema, the algorithm induces primary changes in one current or operating temperature and corrects for secondary changes in the other currents with an adaptive filter or estimator. This approach compensates for wavelength shifts or power changes and mirror misalignment induced when the control adjusts its primary variable. These changes are then used to compensate values in the aging model for the other wavelength settings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part thereof, and which is shown, by way of illustration, an embodiment of the present invention. It is understood that other embodiments may be utilized and structural changes may be made without departing from the scope of the present invention.

1. Overview

Figure 1A:
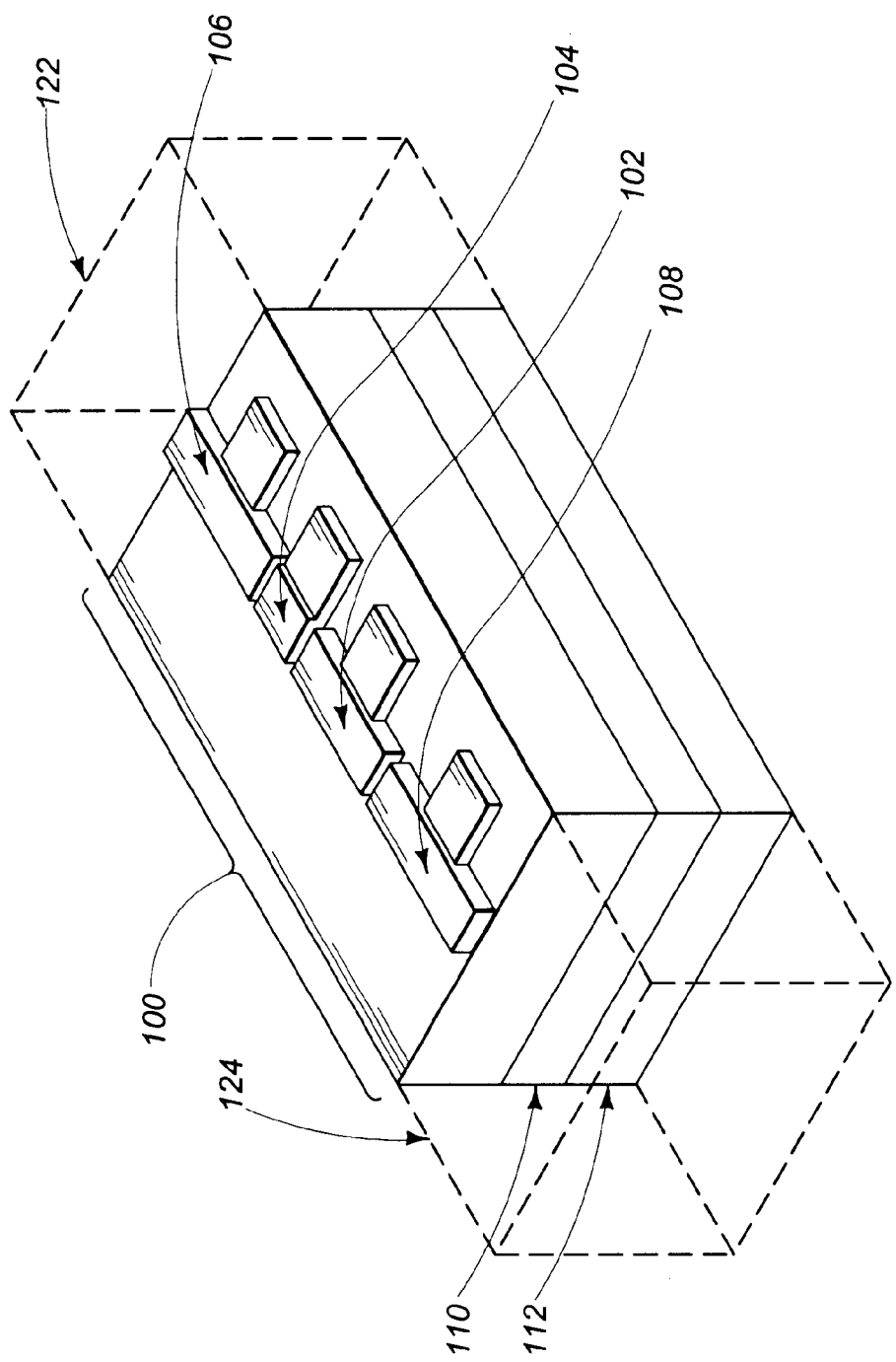
FIGS. 1A and 1B depict a typical multiple-section, widely-tunable laser as used in the invention.
Figure 1B:
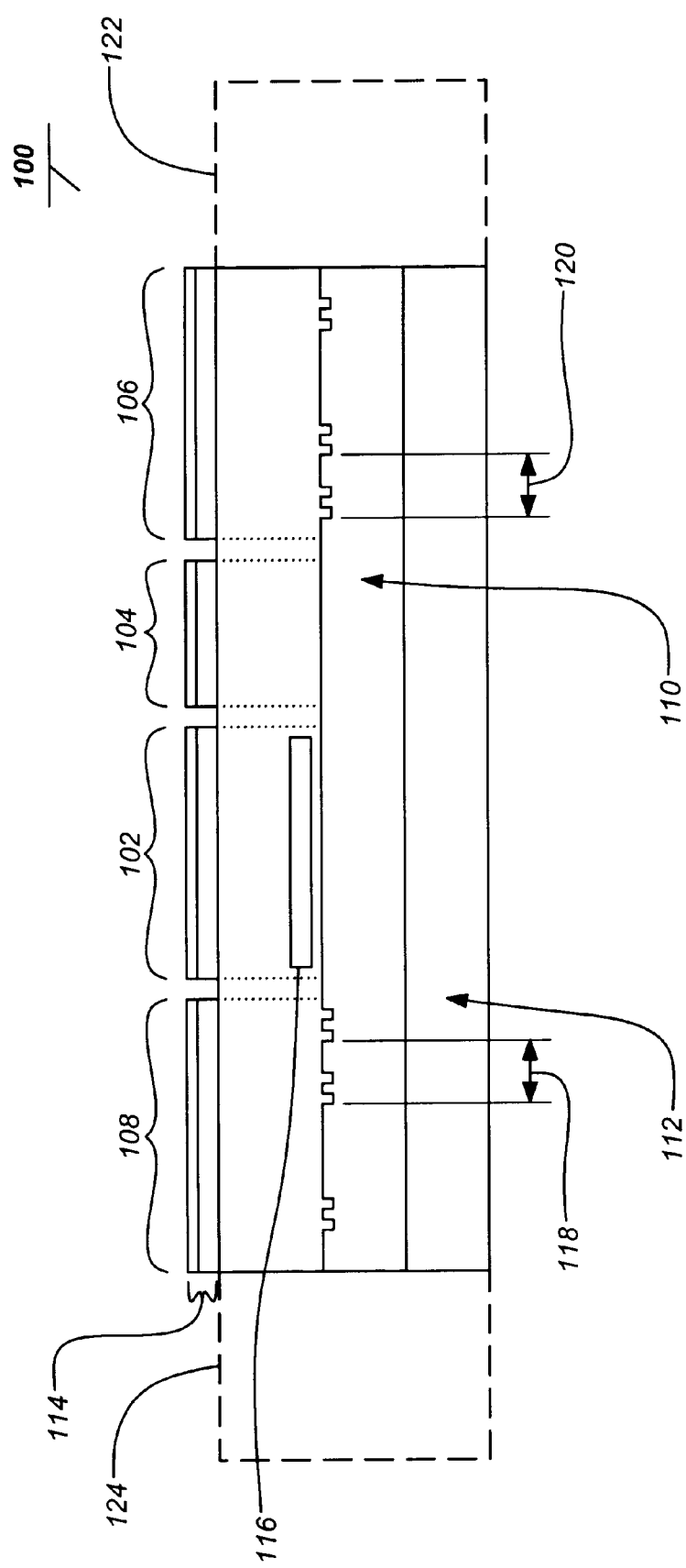

FIGS. 1A and 1B depict a typical multiple-section, widely-tunable laser 100 as used in the invention. A typical SGDBR laser 100 as used in the invention essentially comprises four sections that allow its unique tuning characteristics. The laser 100 is comprised of a gain section 102, a phase section 104, a back mirror 106 and a front mirror 108. Below these sections is a waveguide 100 for guiding and reflecting the light beam, while the entire device is formed on a substrate 112. In use, bias voltages are connected to the electrodes 114 on the top of the device and a ground is connected to a lower substrate 112. When a bias voltage on the gain section 102 is above a lasing threshold, a laser output is produced from an active region 116.

The front and back mirrors 108, 106 are typically sampled grating mirrors that respectively include different sampling periods 118, 120. The gratings behave as wavelength-selective reflectors such that partial reflections are produced at periodic wavelength spacings of an optical signal carried in the cavity. The front and back sampled grating mirrors 108, 106 together determine the wavelength with the minimum cavity loss through their effective lengths and grating differential; however, the lasing wavelength can only occur at the longitudinal modes of the optical cavity in the waveguide 110. Therefore, it is important to adjust the mirrors 106, 108 and waveguide 110 modes to coincide, thereby achieving the lowest cavity loss possible for the desired wavelength and maximum mode stability. The phase section 104 of the device shown in FIG. 1 is used to adjust the optical length of the cavity in order to position the cavity modes.

Optional back-side monitor 122 and front-side semiconductor optical amplifier (SOA) and/or optical modulator 124 sections are also indicated. Currents are applied to the various electrodes 114 of the aforementioned sections to provide a desired output optical power and wavelength as discussed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. As described therein, a current to the gain section 102 creates light and provides gain to overcomes losses in the laser cavity; currents to the two differing SGDBR wavelength-selective mirrors 106, 108 are used to tune a net low-loss window across a wide wavelength range to select a given mode; and a current to the phase section 104 provides for a fine tuning of the mode wavelength. It should also be understood that the sections are somewhat interactive, so that currents to one section will have some effect on the parameters primarily controlled by the others.

Currents and voltages are applied and/or monitored at the optical sections to monitor power or wavelength, or provide amplification or modulation as specified in commonly-assigned and co-pending applications, namely application Ser. No. 09/614,378, filed on Jul. 12, 2000, by Gregory Fish et al., and entitled "OPTOELECTRONIC LASER WITH INTEGRATED MODULATOR,"; application Ser. No. 09/614,377, filed on Jul. 12, 2000, by Larry Coldren, and entitled "INTEGRATED OPTOELECTRONIC WAVELENGTH CONVERTER,"; and application Ser. No. 09/614,375, filed on Jul. 12, 2000, by Beck Mason et al., and entitled "TUNABLE LASER SOURCE WITH INTEGRATED OPTICAL AMPLIFIER," each of which claims priority to Provisional Applications Serial No. 60/152,072, 60/152,049 and 60/152,072, all filed on Sep. 2, 1999; all of which applications are incorporated by reference herein. The current invention operates under the same general principles and techniques as these background inventions.

Figure 2:
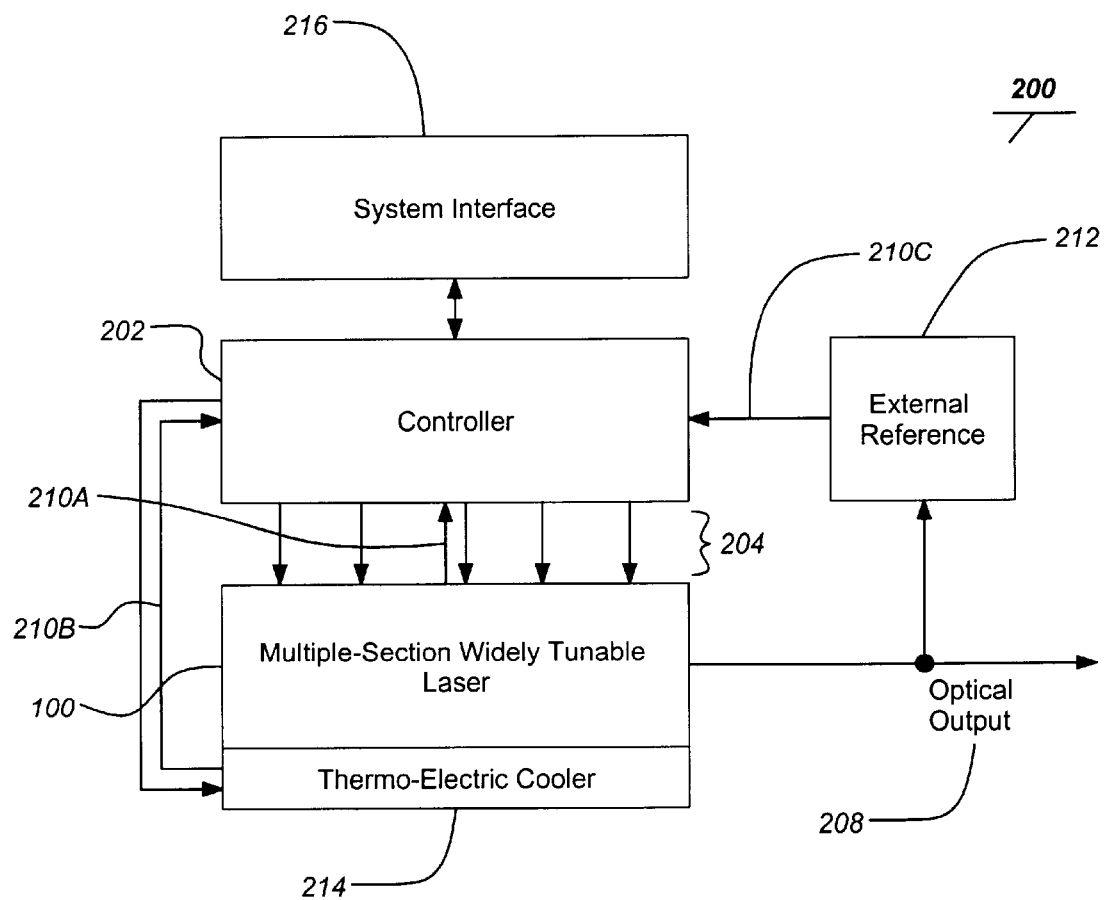
FIG. 2 is a block diagram of a typical embodiment of the invention.

FIG. 2 is a block diagram of a typical control system 200 embodiment of the invention. In general, the controller 202 applies input signals 204 to the various sections of the laser 206 to operate it and produce a laser output 208 at a desired wavelength. Many factors may influence the laser output 208 and the controller 202 optimally stabilizes the laser output 208 over the life of the laser 206. In closed-loop variants of the control system 200, the controller 202 may monitor the laser 206 and its output via feedback signals 210 and adjust the various laser inputs 204 accordingly. For example, in one embodiment the laser 206 monitors the feedback signals 210 of the multiple-section, widely tunable laser gain section voltage, temperature, and an external reference 212, such as a wavelength locker (e.g. a Fabry-Perot Etalon), via respective feedback signals 210A–210C. The controller 202 adjusts the laser section currents and temperature to maintain a fixed optical power and wavelength. The Laser temperature is regulated with a cooling device 214, such as a thermoelectric cooler (TEC), via a separate control loop. The laser 206 generates continuous optical output power.

The controller 202 interfaces to the host over a system interface 216, such as a serial or parallel interface. The host commands the operation of the controller 202. The controller 202 regulates the laser optical output power and wavelength and may operate in one of the following control modes:

A. Open loop control using fixed operating points.
B. Power and wavelength control using open loop control's fixed operating points as initial operating points and regulating the optical power and wavelength to a reference thereafter.
C. Gain voltage control using open loop control's fixed operating points as initial operating points and regulating the Laser mirror alignment with the cavity mode thereafter.
D. Regulating power, wavelength, and gain voltage using open loop control's fixed operating points as initial operating points.

Various embodiments of the control modes are detailed hereafter.

2.0 Open Loop Control

Figure 3:
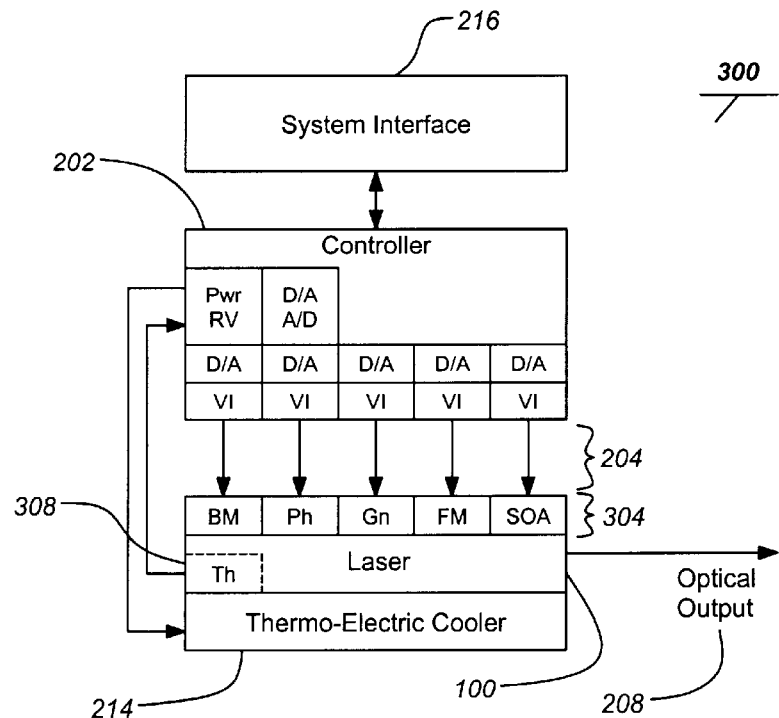
FIG. 3 illustrates an open loop control system of present invention.

FIG. 3 illustrates an open loop control system 300 that sets the laser optical output 208 power and wavelength by setting the laser section current inputs 204 from values in an aging model stored in the controller 202. The current inputs 204 may be applied, for example, to a back mirror (BM), phase (Ph), Gain (Gn), front mirror (FM), and optical amplifier (SOA) sections of the laser 304. The controller 202 regulates the laser temperature to a fixed value by monitoring a sensor 308 and controlling the cooler 214 accordingly. The current input 204 settings or operating points of the various sections of the laser 304 are generated by a calibration routine. The settings are fixed over the lifetime of the product. The choice of the operating current inputs 204, the current sources, and temperature regulator guarantees maximum stability of the optical output wavelength and power over operating lifetime and ambient environmental conditions.

As previously mentioned, the integrated optical amplifier (SOA), like the integrated modulator, is optional and not included on all designs.

2.1 Operating Points

The laser operating points are determined by either an incremental calibration routine or a mirror reflectivity peak calibration routine.

2.1.1 Incremental Calibration

Incremental calibration steps and locks the laser to each channel, such as each ITU wavelength channel using a calibrated wavelength locker as a reference, such as a Fabry-Perot etalon. It steps to the next channel by adjusting the phase current and locking the mirrors to the cavity mode with gain voltage control. Once at the channel, it locks the Laser wavelength to the channel by adjusting the phase current using wavelength control and the laser power to a predetermined set point by adjusting the gain current with power control.

Incremental calibration starts with the mirrors aligned at mirror reflectivity peak 0 and then searches for the next lower channel. At each cavity mode, it resets the phase current to its initial value and continues the search. At the end of each mirror tuning range, the mirror currents are reset to the next mirror reflectivity peak. Once the wavelength wraps around, the process is repeated at mirror reflectivity peak 0 by searching for the next upper channel.

Figure 4A:
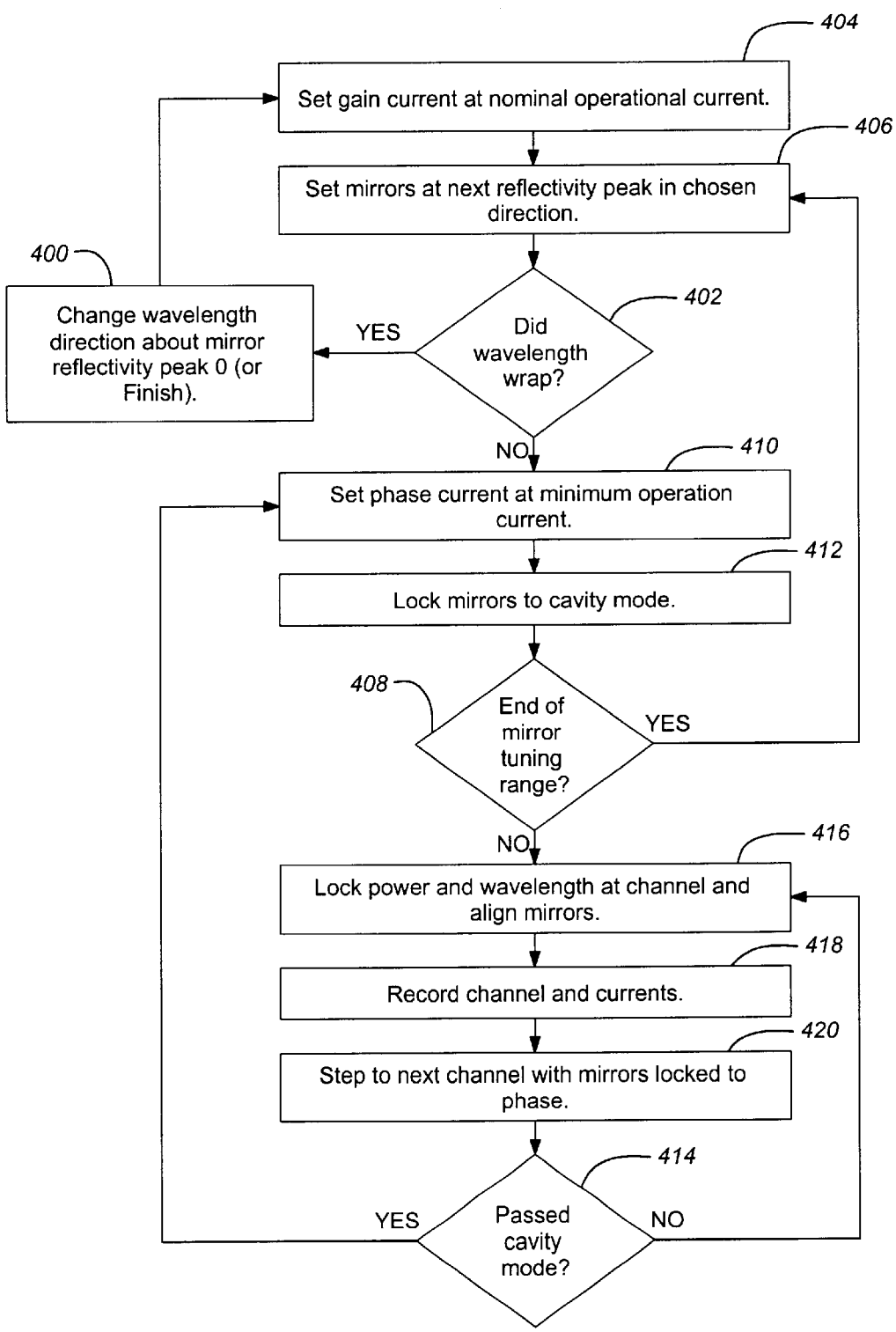
FIGS. 4A–4B are flowcharts of the incremental and mirror reflectivity peak calibration processes.

FIG. 4A is a flowchart of the incremental calibration process. The typical process may begin by setting the gain current at a nominal operation current at block 404. The mirrors are set at the next reflectivity peak in a chosen direction (up or down) at block 406. If the wavelength wrapped at block 402, the chosen direction is changed at block 400 and the process begins again. If the wavelength did not wrap, the phase current is set at a minimum operation current at block 410 and the mirrors are locked to the cavity mode at block 412. If the mirrors have reached the end of their tuning range at block 408, the process resets to block 406 at the next reflectivity peak. If the tuning range has not been reached, the power and wavelength are locked at the channel and the mirrors are aligned at block 416. The channel and corresponding input currents are recorded at block 418 and the laser is stepped to the next channel with the mirrors lock to phase at block 420. If the cavity mode has been passed at block 414, the process restarts at block 410 to reset the phase current. If the cavity mode has not been passed, power and wavelength are locked again at the new channel as the process resets to block 416. This process will continue until a change in wavelength is indicated again at block 400. At this point, the processes ends.

The following pseudo-code also describes the logic of the incremental calibration shown in FIG. 4A.

For each wavelength direction about mirror reflectivity peak 0
   Until (wavelength wraps)
   Set gain current at nominal operation current
   Set mirrors at next reflectivity peak
   Until (end of mirror tuning range)
     Set phase current at minimum operational current
     Lock mirrors to cavity mode
     Until (passes cavity mode)
       Lock power and wavelength at channel and align mirrors
       Record channel and currents
       Step to next channel with mirrors locked to phase 2.1.2 Mirror Reflectivity Peak Calibration Mirror reflectivity peak calibration determines the mirror reflectivity peaks, generates the mirror tuning efficiency curves, and uses to set the mirror currents for each channel.

Figure 4B:
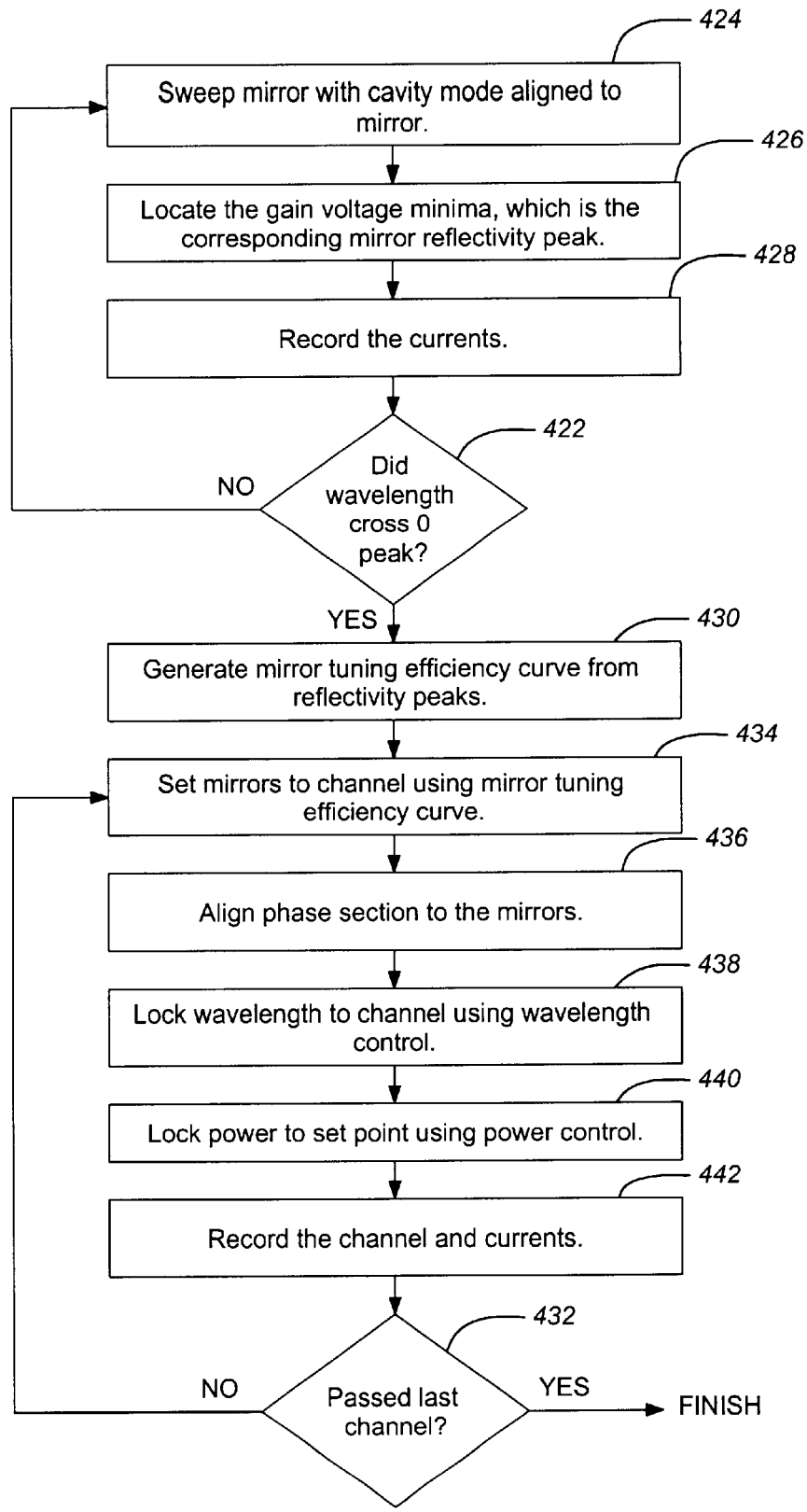

FIG. 4B is a flowchart of the mirror reflectivity peak calibration process. The process may begin with sweeping the mirror with the cavity mode aligned to the mirror at block 424. The gain voltage minima, which correspond to the mirror reflectivity peaks, are located at block 426. The currents corresponding to the minima are recorded at block 428. If the wavelength does not cross the 0 peak at block 422, the process returns to block 424 to continue sweeping the mirror. Otherwise, a mirror tuning efficiency curve is generated from the reflectivity peaks at block 430. Then at block 434 the mirrors are set to a channel using the mirror tuning efficiency curve. The phase section is aligned to the mirrors at block 436 and the wavelength is locked to the channel using wavelength control at block 438. Finally, the power is locked to the set point using the power control at block 440 and the channel and input currents are recorded at block 442. The process ends when the last channel has been located as checked at block 432.

The following pseudo-code also describes the logic of the mirror reflectivity peak calibration shown in FIG. 4B.

Figure 5:
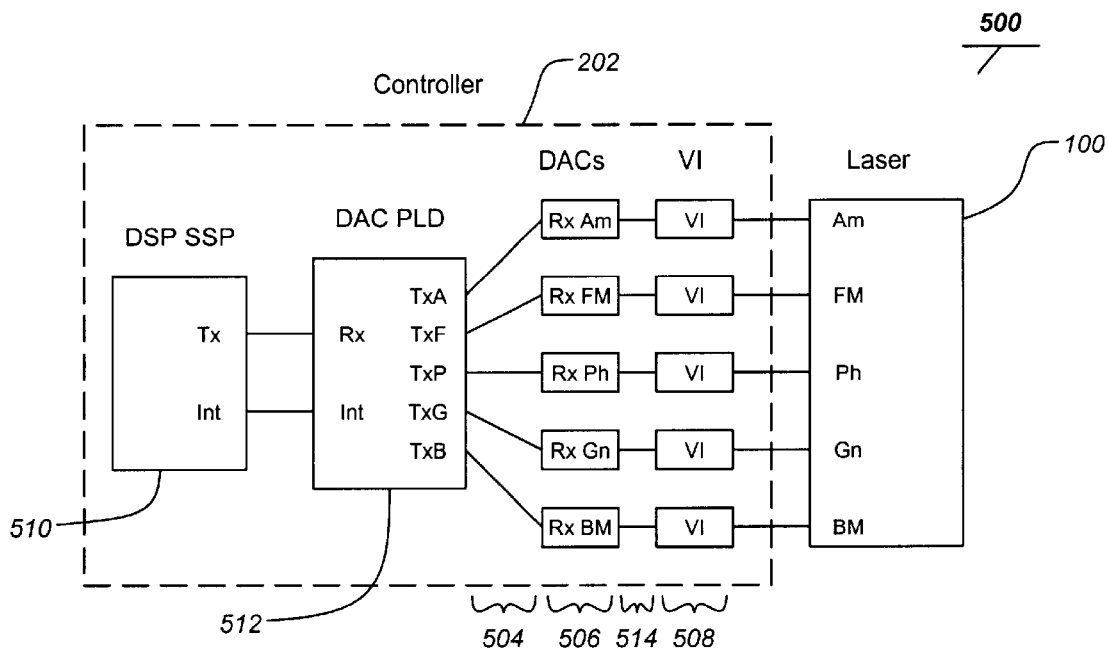
FIG. 5 is a block diagram of the current sources used in the controller.

Until (wavelength crosses mirror reflectivity peak 0)
   Sweep mirror with cavity mode aligned to mirror
   Locate the gain voltage minima, which is the corresponding mirror reflectivity peak.
   Record the currents
   Generate mirror tuning efficiency curve from reflectivity peaks
Until (step through all channels)
   Set mirrors to channel using mirror tuning efficiency curve
   Align phase section to the mirrors
   Lock wavelength to channel using wavelength control
   Lock power to set point using power control
   Record the channel and currents 2.2 Current Sources FIG. 5 is a block diagram of the current sources 500 used in the controller 202. The Controller current sources 500 drive the phase, mirror, amplifier, and gain sections of the laser 100. The current sources are comprised of a voltage reference 504, individual 16-bit digital to analog converters 506 (DACs), and voltage to current (VI) amplifiers 508. The DACs 506 connect to the digital signal processor (DSP) synchronous serial port 510 (SSP) through a programmable logic device 512 (PLD). The PLD 512 provides a logic interface between the DSP SSP 510 and the DACs 506. The VI amplifiers 508 translates the DAC voltage outputs 514 to proportional current inputs 204 that drive the laser sections.

2.2.1 Voltage to Current Converter

Figure 6:
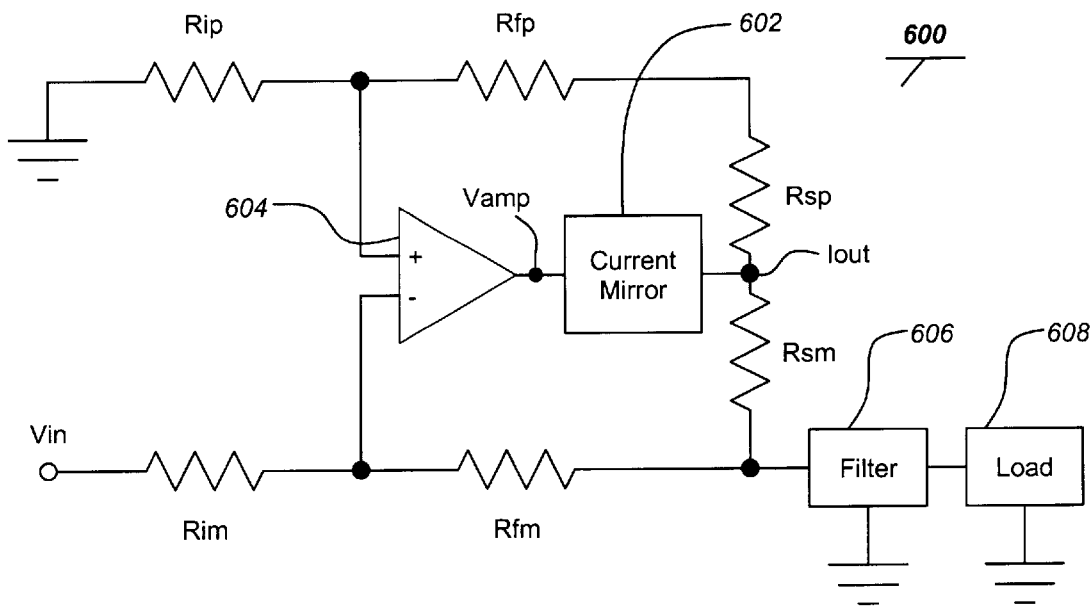
FIG. 6 illustrates a typical current source circuit of the present invention.

FIG. 6 illustrates a typical current source circuit 600 of the present invention. The voltage to current amplifier is a modified Howland circuit source (MHCS). A current mirror 602 is added to the output stage of the amplifier 604 to increase the drive current beyond that of the amplifier 604 alone. A filter stage 606 is added at the load 608 to reduce noise.

Figure 7:
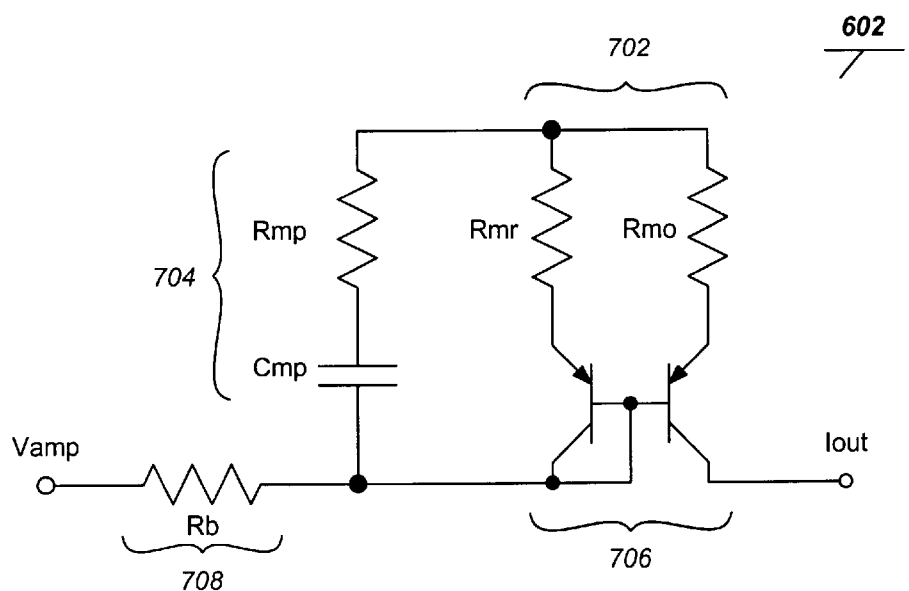
FIG. 7 illustrates a typical current mirror circuit of the present invention.

FIG. 7 illustrates a typical current mirror circuit 602 of the present invention. The current mirror inverts the output of the amplifier 604, which requires the source, Vin, at the inverting code of the amplifier 604 of the current source circuit 600.

The current mirror operates at a fixed gain that is determined, primarily, by the ratio of the resistors 702 in the emitter leads of the transistors. An RC compensation network 704 is added to insure stability of the amplifier and current mirror. The gain of the current is variable up to a maximum ratio. The maximum ratio is determined by the additional drift introduced by heating of the transistor 706 and sense resistor 708 and the maximum thermal loss that can be sustained by the transistor 706 and sense resistor 708. If additional gain is required, an additional Qmo and Rmo section can be added to the mirror 602.

3 Power and Wavelength Control

Figure 8A:
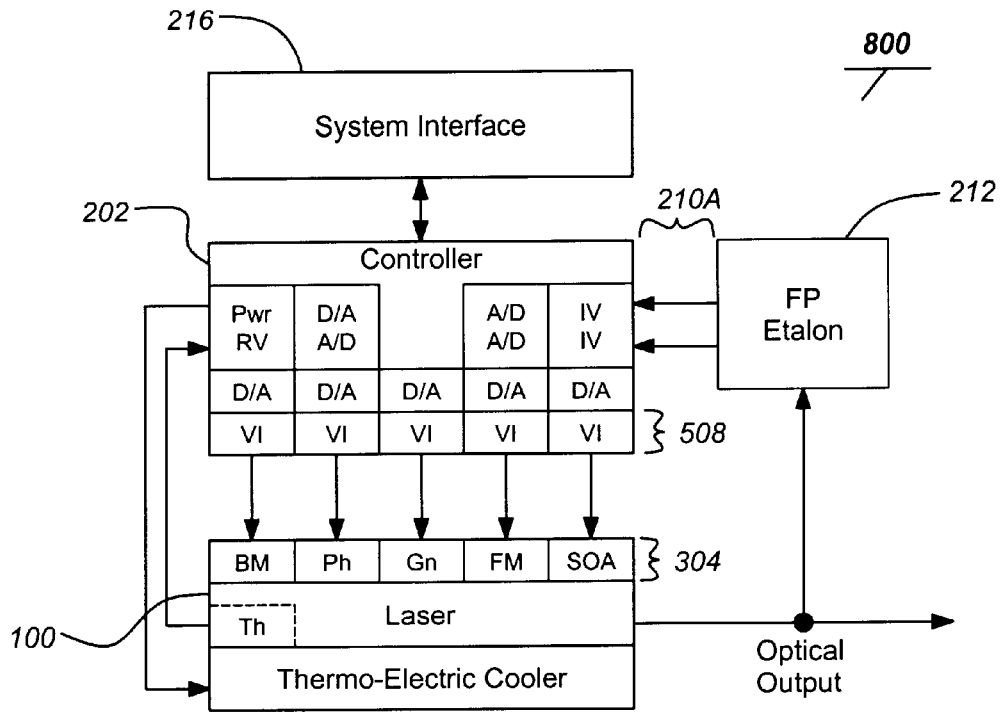
FIGS. 8A–8C illustrate a typical closed loop power and wavelength control system.
Figure 8B:
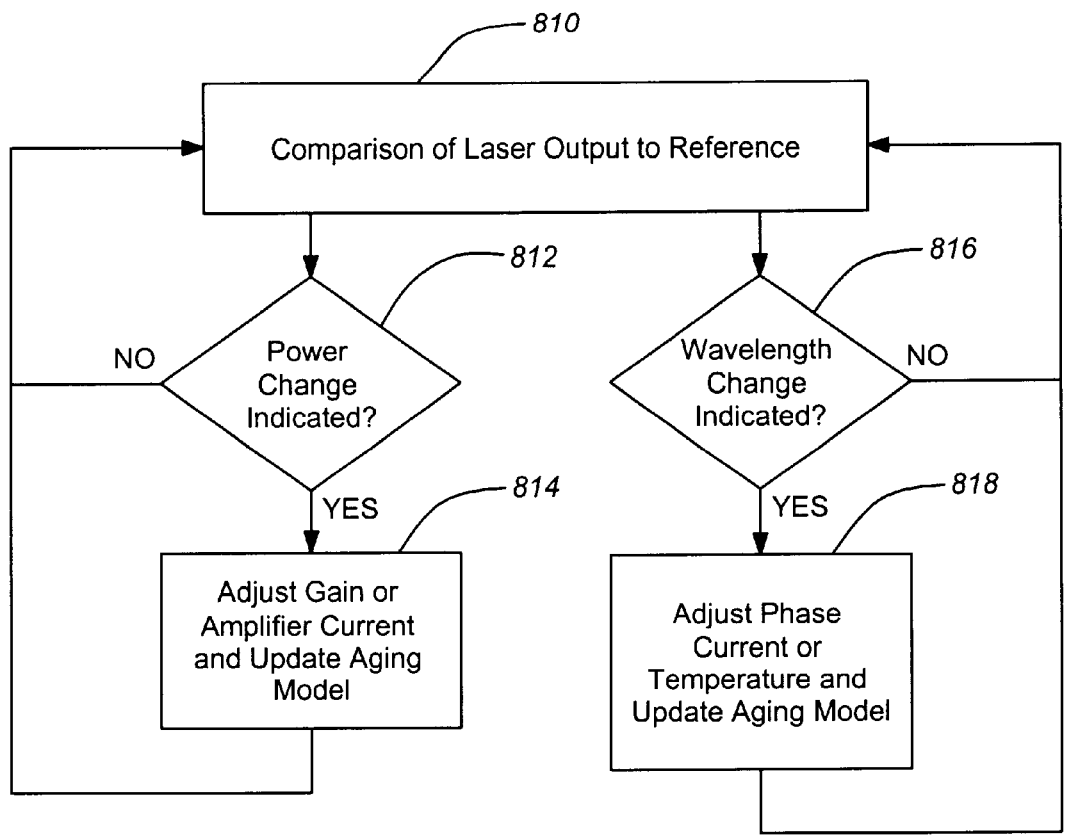
Figure 8C:
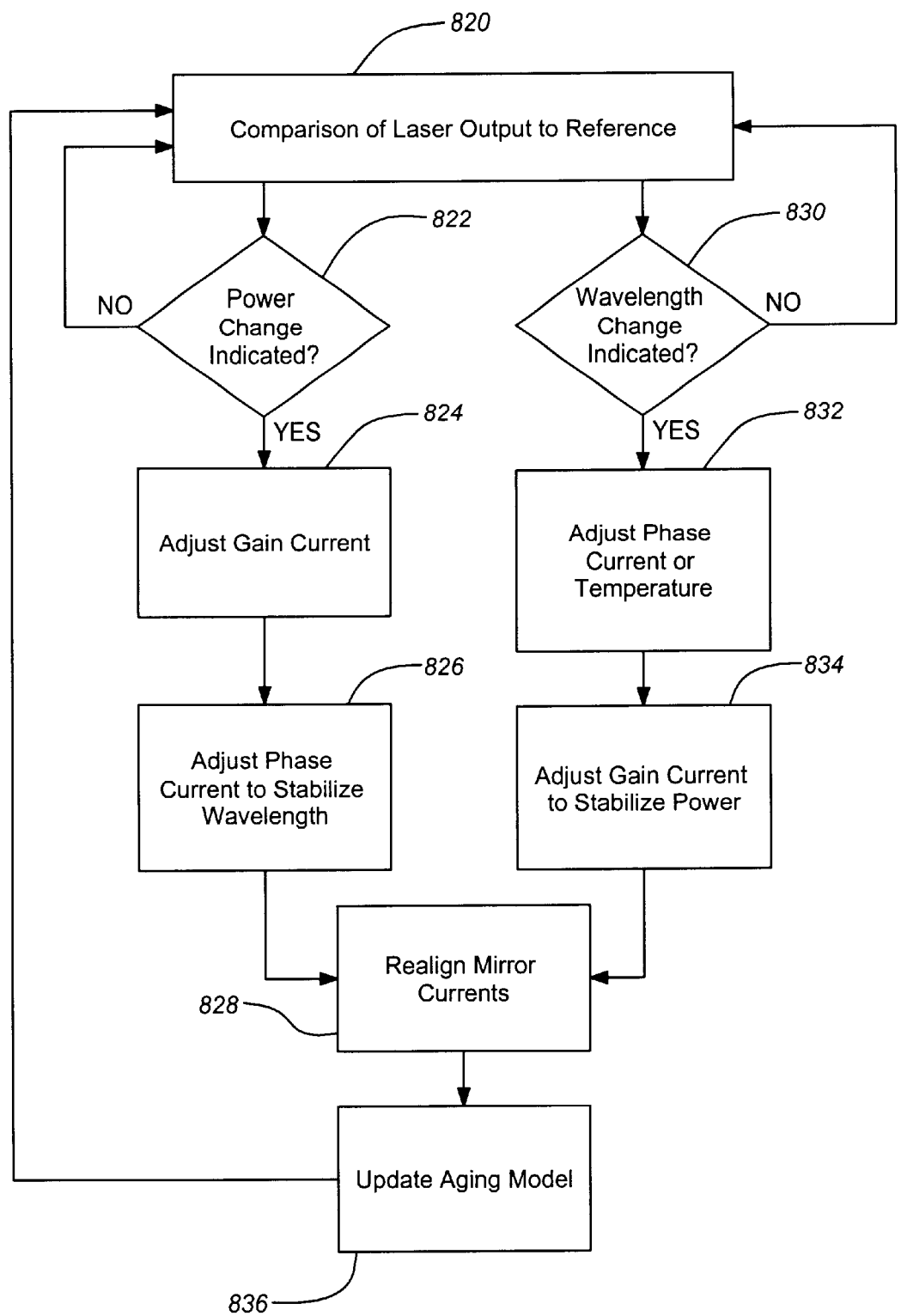

FIGS. 8A–8C illustrate a typical closed loop power and wavelength control system. FIG. 8A illustrates the control block diagram. Power and wavelength control 800 combines open loop control (as shown in FIG. 3) and feedback 210A from an external wavelength locker (e.g., a Fabry-Perot Etalon) reference 212 to lock the laser optical output power and wavelength to the reference 212. Power and wavelength control compensates for drift in the controller current sources 508 and the laser operating points over time and temperature.

Once new currents to the various sections 304 are established by locking to the external wavelength reference 212 for a given channel, the aging model or loopkup table can be updated so that the system is adapted to small changes in device characteristics as it ages. Also, by using a formula based upon the initial calibration characteristics, the currents for the other desired operating powers and wavelength channels stored in the aging model can be adjusted as well. For example, the currents for each section at any other channel are adjusted in proportion to the change in that section current at the operating channel.

$$dIgain=Igain,change/Igain,calibration \text{ [at operating channel]}$$

$$change=(Igain,calibration+dIgain*Igain,calibration \text{ [at any other channel]}$$

This is done for each section current. This insures that desired operating channels can always be accessed over the device's lifetime.

The power and wavelength controls may each operate independently or interdependently with other laser inputs.

3.1 Independent

FIG. 8B is a flow diagram of independent control of the power and wavelength. The least complex control algorithm is where the controls operate independently. Each control algorithm induces changes in one laser input, such as a current or temperature, independent of the other laser inputs. The control algorithms are classical proportional, integral control routines. The laser output is compared to the reference to identify whether a change in optical power and/or optical wavelength is indicated at block 810. If a change in the optical power is indicated at block 812, the optical power is adjusted by the gain current (Ign) or by the current to a SOA (if integrated into the Laser) at block 814. If a change in the optical wavelength is indicated at block 814, optical wavelength is adjusted by the phase current (Iph) or the submount temperature at block 818. Of course, the order of the power or wavelength adjustment is unimportant. In addition, the aging model may be updated whenever a change (in power or wavelength) is indicated. Mirror currents are left fixed.

3.2 Interdependent

FIG. 8C is a flow diagram of interdependent control of the power and wavelength. The independent control algorithm is slow and marginally stable in its response to changes in the optical power output and optical wavelength. The mirrors and cavity mode become misaligned as the control algorithm adjusts the gain and phase currents from their predefined values. The quality of the optical output is reduced (decreased side mode suppression ratio) and the probability of a mode hop is increased (wavelength shift) as the mirrors and cavity mode become misaligned.

The interdependent control algorithm primary changes in one laser input, such as a current or temperature, and corrects for secondary changes in at least one other laser input with an adaptive filter or estimator. This compensates for wavelength shifts or power changes and mirror misalignment induced when the control adjusts its primary variable. Here also, the laser output is compared to the reference to identify whether a change in optical power and/or optical wavelength is indicated at block 820. If a change in the optical power is indicated at block 822, the power is adjusted by the gain current (Ign) at block 824 and the wavelength is stabilized by adjusting the phase current (Iph) by an adaptive filter at block 826. The mirror currents are realigned by a fixed estimator at block 828. Following this, the aging model is updated at block 836. If a change in the optical wavelength is indicated at block 830, wavelength is adjusted by the phase current (Iph) or the carrier temperature at block 832. The power is stabilized by adjusting the gain current (Ign) by an adaptive filter at block 834, and the mirror currents are realigned by a fixed estimator at block 828. Here too, the aging model is updated at block 836.

The interdependent controls provide more robust, stable, and faster convergence of the power and wavelength to its reference value.

As outlined above, the aging model is then updated to reflect the new model coefficients whereby the currents from the aging model or look-up table are adjusted for a given desired wavelength and power. Also, the changes required for this particular channel can be used to estimate the changes required for all other channels.

4.0 Gain Voltage Control

Gain Voltage Control uses feedback from the Laser gain section voltage to keep the mirrors aligned with the cavity mode. It aligns the mirrors by minimizing the Laser gain section voltage. The Laser gain section voltage minimum is where the cavity loss is a minimum. It corresponds to maximum optical power output, wavelength stability, and side mode suppression ratio.

Gain voltage control is implemented in the DSP using a numerical minima search or a least mean square (LMS) quadratic estimator or in analog circuitry using a phase locker (PL) circuit.

4.1 DSP Gain Voltage Control

Figure 9:
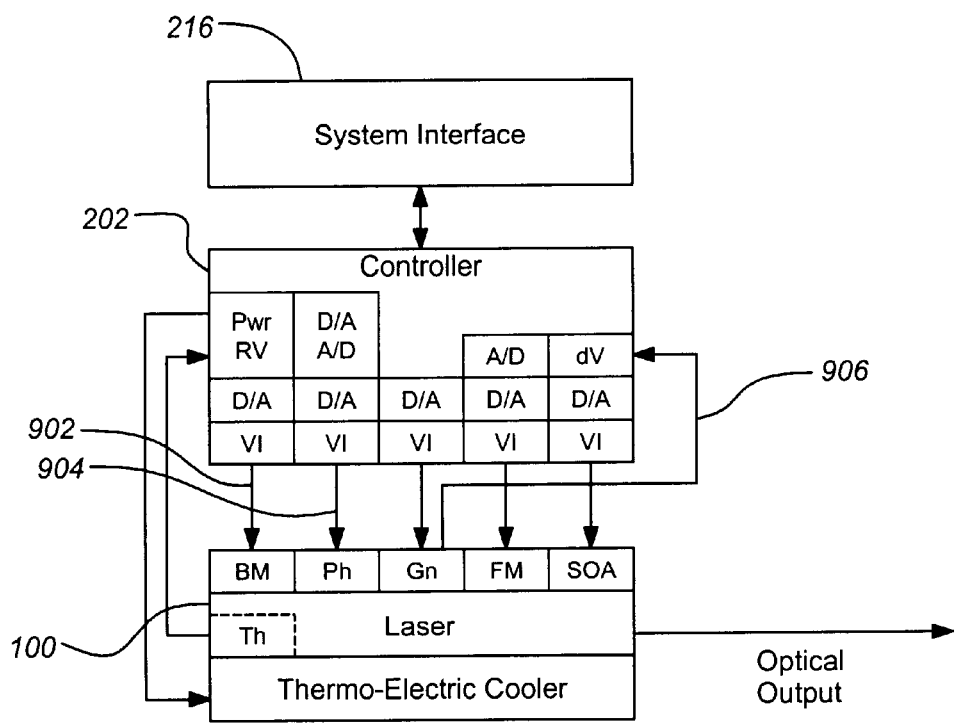
FIG. 9 illustrates the DSP gain voltage control block diagram.

FIG. 9 illustrates the DSP gain voltage control block diagram. The DSP dithers the Laser mirror currents 902, 904 and monitors the Laser gain section voltage 906. It uses a numerical algorithm to align the mirrors by locating the minima of the Laser gain section voltage.

4.1.1 DSP Minima Search Algorithm

The minima search algorithm uses three data points (mirror current, gain voltage) and estimates the slope of the gain voltage curve with respect to the mirror current. The algorithm steps towards the gain voltage minima and calculates the next data point and uses the new data point and the two best points to re-estimate the slope of the gain voltage curve. The algorithm continues the above step process, continually searching for the gain voltage minima.

4.1.2 DSP LMS Estimator

The minima search algorithm is susceptible to wandering around the gain voltage minima due to noise in the sampled gain voltage signal. The wandering is reflected as drift and noise on the optical signal. The LMS estimator reduces the wander and noise by using an array of data points to estimate the gain voltage surface, in effect, filtering the noise. The LMS estimator converges to the gain voltage minima faster and smoother than the minima search.

For fixed phase and gain section currents, the gain section voltage can be modeled using a casual Volterra series expansion over 2 input signals, the front mirror and back mirror currents. For dithering signals in the sub-100 kHz regime, the analog circuitry and the device itself allow a memoryless model, so a 5-tap adaptive quadratic filter model will suffice.

The LMS estimator can then be achieved using either of two classic adaptive filter update algorithms, a standard gradient descent adaptation (LMS or block LMS algorithm) or a (faster) recursive least squares adaptation (RLS algorithm—based on Newton's Method).

The second approach is used to achieve faster convergence of adaptive linear filters when the signals driving the system do not have sufficient spectral flatness to allow a rapid gradient descent. However, in the case of adaptive linear filters, the gradient descent approach converges just as fast as the RLS approach when white noise can be used to drive the system. Recently published results indicate that comparable rates of convergence can be achieved with adaptive quadratic filters if a minor filter structure modification is used and (pseudo) Gaussian white noise can be used to drive the system.

There are two advantages of this LMS estimator approach. First, an initial tap-vector can be stored along with the 4 drive currents in the laser calibration table in flash memory (resulting in much faster convergence). Second, the adaptation step size can be reduced as the system converges, reducing steady-state misadjustment in the mirror section currents.

4.2 Analog Gain Voltage Control

Figure 10:
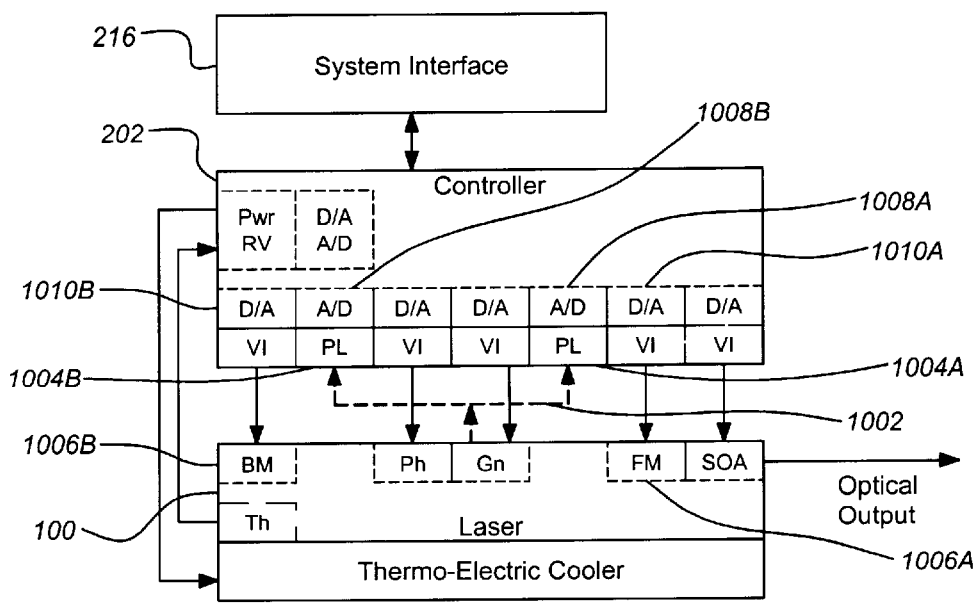
FIG. 10 illustrates the analog gain voltage control block diagram.

FIG. 10 illustrates the analog gain voltage control block diagram. The gain voltage 1002 is connected to analog phase lockers (PL) 1004A, 1004B for each mirror section 1006A, 1006B. The digital algorithms are limited in speed and accuracy by the analog to digital converters (ADC or A/D) 1008A, 1008B and digital to analog converters (DAC or D/A) 1010A, 1010B as well as the signal to noise ratio (SNR) of the circuit. The analog phase locker's speed and accuracy is limited by the SNR of the circuit.

Figure 11:
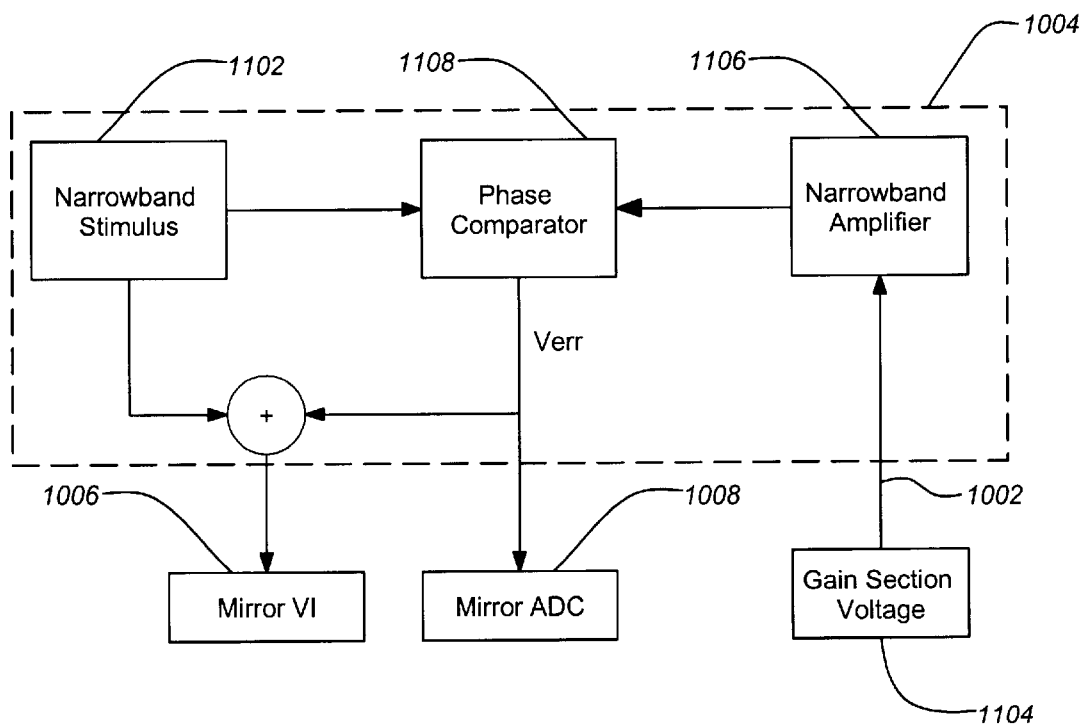
FIG. 11 illustrates the analog phase lock circuit block diagram.

FIG. 11 illustrates the analog phase lock circuit block diagram 1100. The analog phase locker is a high speed, analog-locking loop. It is realized by a phase lock loop (PLL) or RF dither locker. The PL works with the open loop control circuit. The output of the PL adds to the output of the open loop control current sources.

The PL uses a high frequency narrowband stimulus 1102 to dither the mirror current. The gain voltage (Vg) 1104 is measured with a tuned, narrowband amplifier 1106. The phase difference between stimulus and measured signal is extracted by a phase comparator 1108 and drives an error amplifier that adjusts the mirror 1110 current to the gain voltage minima and is sampled by an ADC 1112.

The PL error amplifier output is measured by the DSP. The DSP adjusts the mirror current values in the Open Loop Control aging model to reduce the error to zero. The DSP effectively operates as an integrator function.

Figure 12:
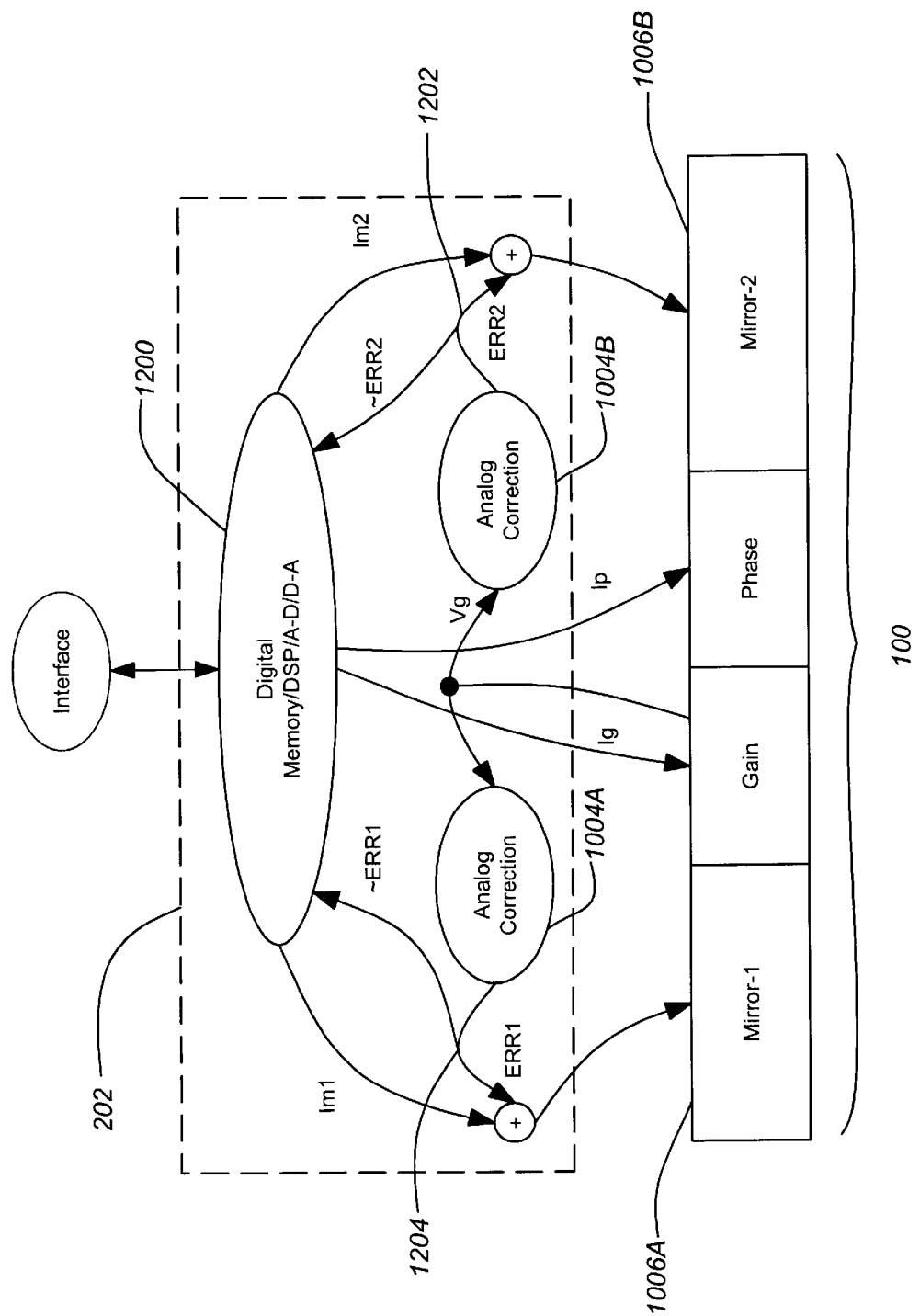
FIG. 12 illustrates the combined operation of analog gain voltage control circuits to correct the outputs to the two mirrors from the open loop digital controller.

FIG. 12 illustrates the combined operation of analog gain voltage control circuits to correct the outputs to the two mirrors from the open loop digital controller. The digital memory/DSP 1200 can set a first approximation current and voltage from a table look up. The analog correction circuits 1004A, 1004B can provide feedback and correction signals to the device as described previously, and the digital controller then monitors the correction signals 1202, 1204 and readjusts the currents and voltages to have the feedback currents from the analog correction portions approach zero. The adjusted currents are used by the aging model to update the aging coefficients. This allows for correction of the laser controller over the life of the SGDBR laser, and accounts for changes in operating temperatures and conditions as well as changes in the operation of the SGDBR laser internal components.

5 Power, Wavelength, and Gain Voltage Control

Power, wavelength, and gain voltage control operates the power and wavelength control and gain voltage control simultaneously.

6 Conclusion

The foregoing description of the preferred embodiment of the invention has been presented for the purposes of illustration and description. It is not intended to be exhaustive or to limit the invention to the precise form disclosed. Many modifications and variations are possible in light of the above teaching. It is not intended that the scope of the invention be limited by this detailed description.

This concludes the description of the preferred embodiment of the present invention. The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optical output power and output wavelength control system for use with a sampled grating distributed Bragg reflector (SGDBR) laser, comprising:

a controller providing current inputs to a front mirror section, a gain section, a phase section and a back mirror section of the SGDBR laser for controlling output power and output wavelength of an optical output of the SGDBR laser; and an external reference receiving the optical output from the SGDBR laser and providing a reference output to the controller based on the optical output;

wherein the controller compares the output power and output wavelength of the SGDBR laser to the reference output and locks the output power and output wavelength of the SGDBR laser to the external reference.

2. The control system of claim 1, wherein the controller further comprises current sources providing each current input for the separate sections of the SGDBR laser.

3. The control system of claim 2, wherein the current sources comprises digital to analog converters separately coupled to voltage to current amplifiers providing the current inputs for the separate sections of the SGDBR laser.

4. The control system of claim 2, further comprising a compensation circuit to control a drift of at least one controller current source.

5. The control system of claim 2, further comprising a compensation circuit to control a drift caused by long-term degradation of the SGDBR laser.

6. The control system of claim 2, further comprising a compensation circuit to control a drift caused by temperature.

7. The control system of claim 1, wherein the controller further comprises an aging model including values which correspond to the current inputs to control the SGDBR laser.

8. The control system of claim 7, wherein the values of the aging model control the SGDBR laser operating power and wavelength.

9. The control system of claim 7, wherein the values of the aging model are based upon a initial calibration of the SGDBR laser.

10. The control system of claim 7, wherein the values of the aging model are updated based upon the comparison of the optical power and output wavelength of the SGDBR laser to the reference output.

11. The control system of claim 10, wherein the updated values correspond to a present operating power and wavelength.

12. The control system of claim 10, wherein updating the values includes using a proportional adjustment based upon an initial calibration to determine the values corresponding to various operating powers and wavelengths.

13. The control system of claim 1, wherein the controller controls the optical output power by adjusting a single laser input independent from other laser inputs.

14. The control system of claim 13, wherein the single laser input is the current input to the gain section of the SGDBR laser.

15. The control system of claim 13, wherein the single laser input is a current input to an optical amplifier section of the SGDBR laser.

16. The control system of claim 1, wherein the controller controls the optical output wavelength by adjusting a single laser input independent from other laser inputs.

17. The control system of claim 16, wherein the single laser input is the current input to the phase section of the SGDBR laser.

18. The control system of claim 16, further comprising a cooler, wherein the single laser input adjusted by the controller comprises a cooler input of the cooler for regulating the temperature of the SGDBR laser.

19. The control system of claim 1, wherein the controller controls the optical output power by adjusting a laser input interdependently with at least one other laser input.

20. The control system of claim 19, wherein the laser input is the current input to the gain section of the SGDBR laser.

21. The control system of claim 19, wherein the at least one other laser input includes the current input to the phase section of the SGDBR laser for stabilizing the output wavelength.

22. The control system of claim 19, wherein the at least one other laser input includes the current inputs to the front and back mirror section of the SGDBR laser for realigning wavelength of the front and back mirror sections with that of a cavity mode of the SGDBR laser.

23. The control system of claim 1, wherein the controller controls the optical output wavelength by adjusting a laser input interdependently with at least one other laser input.

24. The control system of claim 23, wherein the laser input is the current input to the gain section of the SGDBR laser.

25. The control system of claim 23, further comprising a cooler for regulating the temperature of the SGDBR laser, wherein the laser input comprises a cooler input of the cooler.

26. The control system of claim 23, wherein the at least one other laser input includes the current input to the phase section of the SGDBR laser for stabilizing the output wavelength.

27. The control system of claim 23, wherein the at least one other laser input includes the current inputs to the front and back mirror section of the SGDBR laser for realigning wavelengths of the front and back mirror sections with that of a cavity mode of the SGDBR laser.

28. The control system of claim 1, wherein power and wavelength control is operated simultaneously with a gain voltage control of the SGDBR laser.

29. A method of controlling optical output power and output wavelength of a sampled grating distributed Bragg reflector (SGDBR) laser, comprising the steps of:
providing current inputs to a front mirror section, a gain section, a phase section and a back mirror section of the SGDBR laser controlling output power and output wavelength of an optical output of the SGDBR laser; and
receiving the optical output from the laser at an external reference and providing a reference output to control the laser based on the optical output;
comparing the output power and output wavelength of the SGDBR laser to the reference output; and
locking the output power and output wavelength of the SGDBR laser to the external reference.

30. The method of claim 29, wherein current sources provide each current input for the separate sections of the SGDBR laser.

31. The method of claim 30, wherein the current sources comprise digital to analog converters separately coupled to voltage to current amplifiers providing the current inputs for the separate sections of the SGDBR laser.

32. The method of claim 30, further comprising a compensation circuit to control a drift of at least one of the current sources.

33. The method of claim 30, further comprising a compensation circuit to control a drift caused by long-term degradation of the SGDBR laser.

34. The method of claim 30, further comprising a compensation circuit to control a drift caused by temperature.

35. The method of claim 29, further comprising using an aging model including values which correspond to the current inputs to control the SGDBR laser.

36. The method of claim 35, wherein the values of the aging model control the SGDBR laser operating power and wavelength.

37. The method of claim 35, wherein the values of the aging model are based upon an initial calibration of the SGDBR laser.

38. The method of claim 35, wherein the values of the aging model are updated based upon the comparison of the optical output power and output wavelength of the SGDBR laser to the reference output.

39. The method of claim 38, wherein the updated values correspond to a present operating power and wavelength.

40. The method of claim 39, wherein updating the values includes using a proportional adjustment based upon an initial calibration to determine the values corresponding to various operating powers and wavelengths.

41. The method of claim 39, further comprising controlling the optical output power by adjusting a single laser input independent from other laser inputs.

42. The method of claim 41, wherein the single laser input is the current input to the gain section of the SGDBR laser.

43. The method of claim 41, wherein the single laser input is a current input to an optical amplifier section of the SGDBR laser.

44. The method of claim 39, further comprising controlling the optical output wavelength by adjusting a single laser input independent from other laser inputs.

45. The method of claim 44, wherein the single laser input is the current input to the phase section of the SGDBR laser.

46. The method of claim 44, further comprising a cooler, wherein the single laser input comprises a cooler input of the cooler for regulating the temperature of the SGDBR laser.

47. The method of claim 39, further comprising controlling the optical output power by adjusting a laser input interdependently with at least one other laser input.

48. The method of claim 47, wherein the laser input is the current input to the gain section of the SGDBR laser.

49. The method of claim 47, wherein the at least one other laser input includes the current input to the phase section of the SGDBR laser for stabilizing the output wavelength.

50. The method of claim 47, wherein the at least one other laser input includes the current inputs to the front and back mirror section of the SGDBR laser for realigning wavelengths of the front and back mirror sections with that of a cavity mode of the SGDBR laser.

51. The method of claim 39, further comprising controlling the optical output wavelength by adjusting a laser input interdependently with at least one other laser input.

52. The method of claim 51, wherein the laser input is the current input to the gain section of the SGDBR laser.

53. The method of claim 51, further comprising a cooler for regulating the temperature of the SGDBR laser, wherein the laser input comprises a cooler input of the cooler.

54. The method of claim 51, wherein the at least one other laser input includes the current input to the phase section of the SGDBR laser for stabilizing the output wavelength.

55. The method of claim 51, wherein the at least one other laser input includes the current inputs to the front and back mirror section of the SGDBR laser for realigning wavelengths of the front and back mirror sections with that of a cavity mode of the SGDBR laser.

56. The method of claim 29, wherein power and wavelength control is operated simultaneously with the gain voltage control of the SGDBR laser.

57. An article of manufacture embodying logic that causes a programmable device to perform a method of controlling a sampled grating distributed Bragg reflector (SGDBR) laser comprising the steps of:
providing current inputs to a front mirror section, a gain section, a phase section and a back mirror section of the SGDBR laser controlling output power and output wavelength of an optical output of the SGDBR laser; and receiving the optical output from the laser at an external reference and providing a reference output to control the laser based on the optical output;

comparing the output power and output wavelength of the SGDBR laser to the reference output; and locking the output power and output wavelength of the SGDBR laser to the external reference.

58. The article of claim 57, wherein current sources provide each current input for the separate sections of the SGDBR laser.

59. The article of claim 58, wherein the current sources comprises digital to analog converters separately coupled to voltage to current amplifiers providing the current inputs for the separate sections of the SGDBR laser.

60. The article of claim 58, further comprising a compensation circuit to control a drift of at least one of the current sources.

61. The article of claim 58, further comprising a compensation circuit to control a drift caused by long-term degradation of the SGDBR laser.

62. The article of claim 58, further comprising a compensation circuit to control a drift caused by temperature.

63. The article of claim 57, further comprising using an aging model including values which correspond to the current inputs to control the SGDBR laser.

64. The article of claim 63, wherein the values of the aging model control the SGDBR laser operating power and wavelength.

65. The article of claim 63, wherein the values of the aging model are based upon an initial calibration of the SGDBR laser.

66. The article of claim 63, wherein the values of the aging model are updated based upon the comparison of the optical output power and output wavelength of the SGDBR laser to the reference output.

67. The article of claim 66, wherein the updated values correspond to a present operating power and wavelength.

68. The article of claim 66, wherein updating the values includes using a proportional adjustment based upon an initial calibration to determine the values corresponding to various operating powers and wavelengths.

69. The article of claim 57, further comprises controlling the optical output power by adjusting a single laser input independent from other laser inputs.

70. The article of claim 69, wherein the single laser input is the current input to the gain section of the SGDBR laser.

71. The article of claim 69, wherein the single laser input is a current input to an optical amplifier section of the SGDBR laser.

72. The article of claim 57, further comprises controlling the optical output wavelength by adjusting a single laser input independent from other laser inputs.

73. The article of claim 72, wherein the single laser input is the current input to the phase section of the SGDBR laser.

74. The article of claim 72, further comprising a cooler, wherein the single laser input comprises a cooler input of the cooler for regulating the temperature of the SGDBR laser.

75. The article of claim 57, further comprising controlling the optical output power by adjusting a laser input interdependently with at least one other laser input.

76. The article of claim 75, wherein the laser input is the current input to the gain section of the SGDBR laser.

77. The article of claim 75, wherein the at least one other laser input includes the current input to the phase section of the SGDBR laser for stabilizing the output wavelength.

78. The article of claim 75, wherein the at least one other laser input includes the current inputs to the front and back mirror section of the SGDBR laser for realigning wavelengths of the front and back mirror sections with that of a cavity mode of the SGDBR laser.

79. The article of claim 57, further comprising controlling the optical output wavelength by adjusting a laser input interdependently with at least one other laser input.

80. The article of claim 79, wherein the laser input is the current input to the gain section of the SGDBR laser.

81. The article of claim 79, further comprising a cooler for regulating the temperature of the SGDBR laser, wherein the laser input comprises a cooler input of the cooler.

82. The article of claim 79, wherein the at least one other laser input includes the current input to the phase section of the SGDBR laser for stabilizing the output wavelength.

83. The article of claim 79, wherein the at least one other laser input includes the current inputs to the front and back mirror section of the SGDBR laser for realigning wavelengths of the front and back mirror sections with that of a cavity mode of the SGDBR laser.

84. The article of claim 57, wherein power and wavelength control is operated simultaneously with a gain voltage control of the SGDBR laser.

85. The control system of claim 15, wherein the current input to the gain section is held fixed so that power control is substantially independent of wavelength control.

86. The control system of claim 19, wherein the laser input is a current input to an optical amplifier section of the SGDBR laser.

87. The control system of claim 23, wherein the laser input is a current input to an optical amplifier section of the SGDBR laser.

88. The method of claim 43, wherein the current input to the gain section is held fixed so that power control is substantially independent of wavelength control.

89. The method of claim 47, wherein the laser input is a current input to an optical amplifier section of the SGDBR laser.

90. The method of claim 51, wherein the laser input is a current input to an optical amplifier section of the SGDBR laser.

91. The article of claim 71, wherein the current input to the gain section is held fixed so that power control is substantially independent of wavelength control.

92. The article of claim 75, wherein the laser input is a current input to an optical amplifier section of the SGDBR laser.

93. The article of claim 79, wherein the laser input is a current input to an optical amplifier section of the SGDBR laser.

* * * * *

UNITED STATES PATENT AND TRADEMARK OFFICE
CERTIFICATE OF CORRECTION

PATENT NO.    : 6,690,693 B1
DATED         : February 10, 2004
INVENTOR(S)   : Paul F. Crowder It is certified that error appears in the above-identified patent and that said Letters Patent is hereby corrected as shown below:

Title page,
Item [56], References Cited, OTHER PUBLICATIONS,
Line 14, delete "Lattice Press, Wolf., "Silicon Processing for the
VLSI Era: vol. 2- Process Integration", pp. 232-233, 1990, Sunset Beach, California".
Item [56], U.S. PATENT DOCUMENTS
Line 4, delete "6,001,745 A  12/1999 Tu et al....438/782".

Column 13,
Line 8, "wavelength" should read -- wavelengths --.

Column 14,
Line 10, "39" should read -- 38 --.
Lines 14, 22, 30 and 43, "39" should read -- 29 --.

Signed and Sealed this

Seventh Day of September, 2004

JON W. DUDAS
*Director of the United States Patent and Trademark Office*